United States Patent
Lue

(10) Patent No.: US 9,385,184 B2
(45) Date of Patent: Jul. 5, 2016

(54) ACTIVE DEVICE AND SEMICONDUCTOR DEVICE WITH THE SAME

(71) Applicant: MACRONIX INTERNATIONAL CO., LTD., Hsinchu (TW)

(72) Inventor: Hang-Ting Lue, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/541,170

(22) Filed: Nov. 14, 2014

(65) Prior Publication Data

US 2016/0141355 A1     May 19, 2016

(51) Int. Cl.
*H01L 29/76*     (2006.01)
*H01L 29/06*     (2006.01)
*H01L 27/088*     (2006.01)

(52) U.S. Cl.
CPC .......... *H01L 29/0619* (2013.01); *H01L 27/088* (2013.01); *H01L 29/0646* (2013.01); *H01L 29/0642* (2013.01)

(58) Field of Classification Search
CPC .................................................. H01L 29/0642
USPC .......... 257/400, 505, E21.628; 438/414, 420, 438/545
See application file for complete search history.

(56) References Cited

U.S. PATENT DOCUMENTS 7,409,660 B2 *  8/2008  Hung ................... G06F 17/5068
    257/127
7,923,805 B2 *  4/2011  Chang ............. H01L 21/823807
    257/344

* cited by examiner

*Primary Examiner* — Chandra Chaudhari
(74) *Attorney, Agent, or Firm* — McClure, Qualey & Rodack, LLP

(57) ABSTRACT

A semiconductor device is provided, comprising a substrate; a first well having a first conductive type and extending down from a surface of the substrate; a diffusion region doped with impurity of the first conductive type and extending down from a surface of the first well; and a plurality of active devices formed within the diffusion region, and the active devices arranged separately from each other. The active devices are electrically isolated from each other by the diffusion region. The active device is self-isolated by a conductive guarding structure, and the semiconductor device comprising embodied STI-free active devices solves STI edge issues.

19 Claims, 17 Drawing Sheets

ACTIVE DEVICE AND SEMICONDUCTOR DEVICE WITH THE SAME

BACKGROUND

1. Field of the Invention

The disclosure relates in general to an active device and a semiconductor device with the same, and more particularly to a self-isolated active device and a semiconductor device with active devices free of STI.

2. Description of the Related Art

In modern very-large-scale integration (VLSI) technology, the shallow-trench isolation (STI) is usually used to isolate the active devices (such as CMOS transistors) to define the channel width. However, it has been found that the STI edge, in many cases, has several serve issues.

FIG. 1 illustrates a conventional layout of a semiconductor device. The semiconductor device comprises several active devices 10 arranged separately from each other on a substrate and within a first well with the first conductive type, such as a P-well (PW) for the NMOS. Also, a light doping region having the second conductive type (such as N−) is correspondingly confined within the PW and encloses all of the active devices 10 and P-well contact. The adjacent active devices 10 are isolated by the STI. Each active devices 10 comprises a diffusion region DIF with the first conductive type, a first contact region 111 (such as a drain region) and a second contact region 113 (such as a source region) respectively formed in the diffusion region DIF, and a poly gate PG (having a gate contact 115 thereon) formed between the first contact region 111 and the second contact region 113. For the conventional semiconductor device, STI existing between the adjacent active devices 10 cause undesired STI edge issues.

FIG. 2 is a cross-sectional view showing the isolations besides the poly gate of a conventional semiconductor device. A poly gate PG is formed on the gate oxide GOX, and a channel 135 is formed under the poly gate PG and between the isolations STI. FIG. 3A shows the $I_D$-$V_G$ characteristic curves of a typical low voltage (LV) NMOS transistor with 70 Å of the gate oxide (GOX=70 Å) and W/Lg=0.6 µm/0.4 µm, and the curves are measured at a drain bias $V_D$=0.1 V. FIG. 3B shows the $I_D$-$V_G$ characteristic curves of a typical high voltage (HV) NMOS transistor with 370 Å of the gate oxide (GOX=370 Å) and W/Lg=10 µm/1.6 µm, and the curves are measured at a drain bias $V_D$=0.1V. Please refer to FIG. 1~FIG. 3B. The STI edge is often a "weak point" (as circled in FIG. 2) that causes abnormal subthreshold leakage current and leads to an undesirable double hump in the subthreshold $I_D$-$V_G$ characteristics (such as curves Process-1 in FIG. 3A and FIG. 3B). In FIG. 3A and FIG. 3B, curves Process-1 represent the $I_D$-$V_G$ characteristic curves of the typical NMOS transistors with double hump leakage, curves Process-2 represent the $I_D$-$V_G$ characteristic curves of the typical NMOS transistors with improved STI, and curves Process-3 represent the $I_D$-$V_G$ characteristic curves of the typical NMOS transistors with improved STI and sidewall STI pocket implant.

Generally, the STI sidewall often has several non-ideal issues, such as: (1) boron segregation at the STI sidewall that leads to p-well dosage loss; (2) STI induced stress that affects Vt (threshold voltage) stability; and (3) some interface trap or dislocation that enhanced leakages. All these issues cause the non-ideal subthreshold behavior and higher leakage current issues. Although a sidewall STI pocket IMP is frequently applied at the "weak points" (as circled in FIG. 2) to raise the local well-doping at the STI sidewall and suppress the double-hump leakage (curves Process-3), it has drawbacks including: (1) reduced junction breakdown of HVNMOS, because junction (NM) will see more P-well doping at the STI edge; and (2) severe narrow-width effect when the channel width is scaled down. The STI pocket IMP still affects the channel doping and affects the Vt control.

Additionally, due to the configuration of the conventional active devices as shown in FIG. 1, the pitch of the adjacent active devices 10 would be restricted due to the extension of the overlay between the poly gate PG and the diffusion region DIF, particularly the array of the active devices along the x-direction of FIG. 1. Thus, a tight-pitch layout design rule for the conventional active devices is restricted since it is necessary to consider the DIF (diffusion region) rule.

SUMMARY

The disclosure relates to an active device and a semiconductor device with the same. The active device is self-isolated by a conductive guarding structure, and the semiconductor device comprising embodied STI-free active devices can successfully solve undesired STI edge issues of the conventional semiconductor device.

According to one embodiment of the present disclosure, a semiconductor device is provided, comprising a substrate; a first well having a first conductive type and extending down from a surface of the substrate; a diffusion region doped with impurity of the first conductive type and extending down from a surface of the first well; and a plurality of active devices formed within the diffusion region, and the active devices arranged separately from each other. The active devices are electrically isolated from each other by the diffusion region.

According to one embodiment of the present disclosure, an active device formed within a diffusion region having a first conductive type in a substrate is provided. The active device comprises a conductive guarding structure, a first contact region and a second contact region. The conductive guarding structure comprises a middle portion, a first guarding portion and a second guarding portion. The first guarding portion adjoins one side of the middle portion for defining a first region at the diffusion region, wherein the first region is enclosed by the first guarding portion and the middle portion. The second guarding portion, opposite to the first guarding portion, adjoins another side of the middle portion for defining a second region at the diffusion region, wherein the second region is enclosed by the second guarding portion and the middle portion. The first contact region having a second conductive type is formed within the first region of the conductive guarding structure, and the first contact region is spaced apart from the first guarding portion and the middle portion. The second contact region having the second conductive type is formed within the second region of the conductive guarding structure, and the second contact region is spaced apart from the second guarding portion and the middle portion.

The disclosure will become apparent from the following detailed description of the preferred but non-limiting embodiments. The following description is made with reference to the accompanying drawings.

DETAILED DESCRIPTION

In the embodiment of the present disclosure, an active device and a semiconductor device with the same are provided. The embodied active device is self-isolated by a conductive guarding structure (such as a guarding polysilicon also functioning as a gate of the active device), and a semiconductor device comprising the embodied STI-free active devices can successfully solve undesired STI edge issues of the conventional semiconductor device. The embodiment of the present disclosure could be implemented in many different types of the low voltage (LV) semiconductor devices and the high voltage (HV) semiconductor devices, and the disclosure has no particular limitation. The embodiments are provided hereinafter with reference to the accompanying drawings for elaborating an embodied active device and a novel layout of a semiconductor device. It is noted that the descriptions disclosed in the embodiments of the disclosure such as the detailed structures, scale of related elements and material selections are disclosed for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Figure 4:
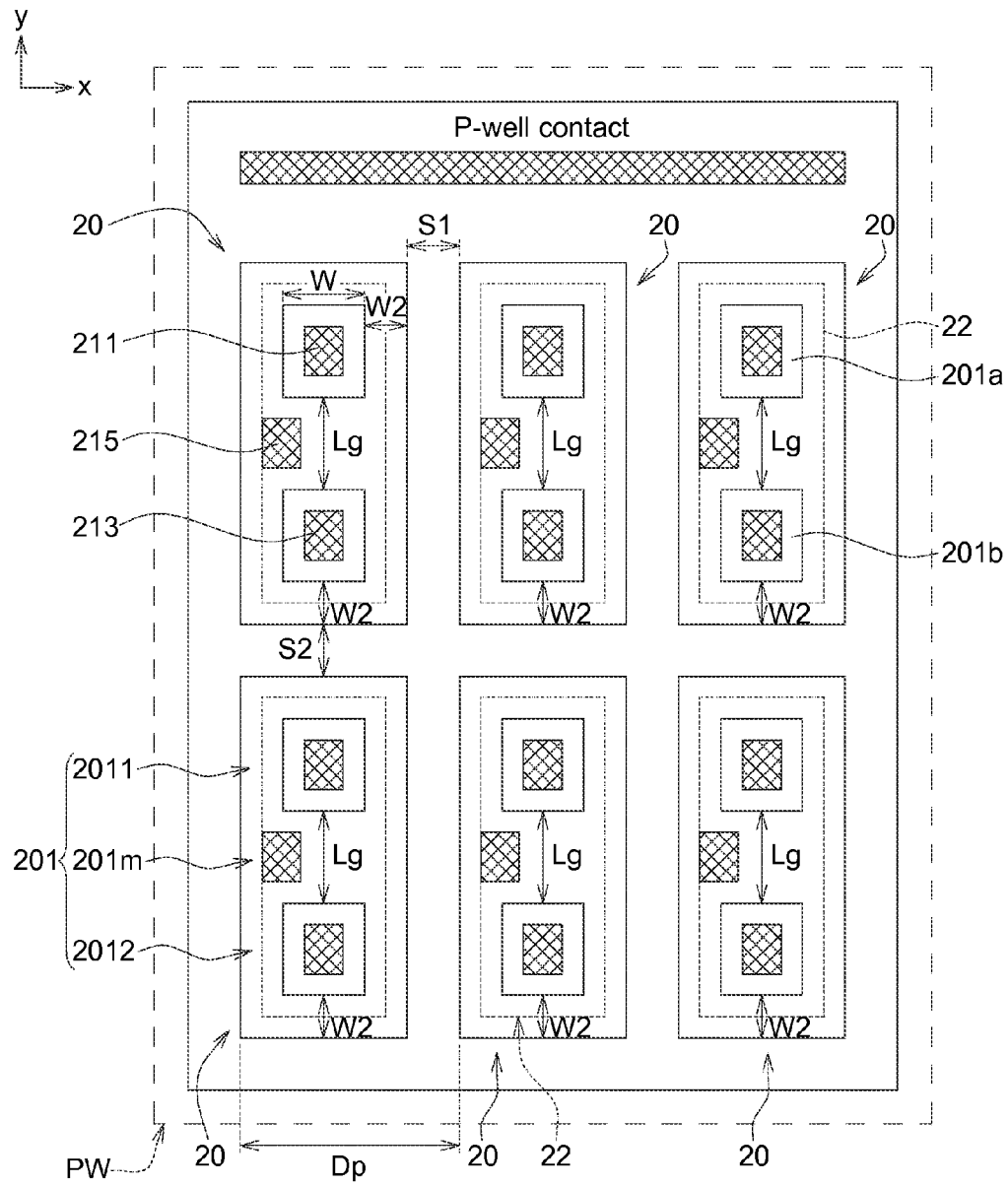
FIG. 4 illustrates a novel layout of a semiconductor device according to the embodiment of the disclosure.
Figure 5A:
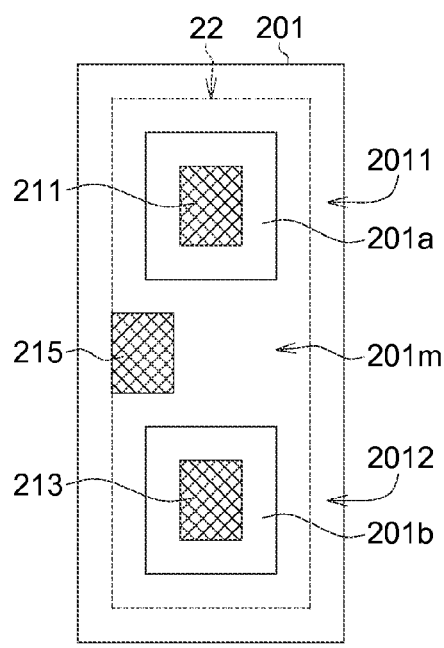
FIG. 5A depicts an active device of a semiconductor device according to the embodiment of the disclosure.
Figure 5B:
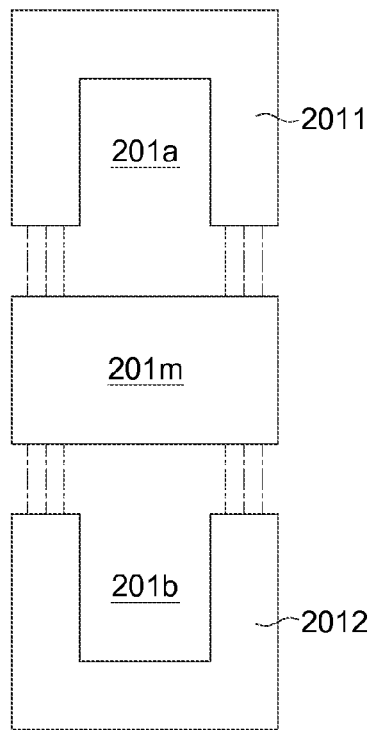
FIG. 5B is an exploded view of a conductive guarding structure of the active device of FIG. 5A.
Figure 6:
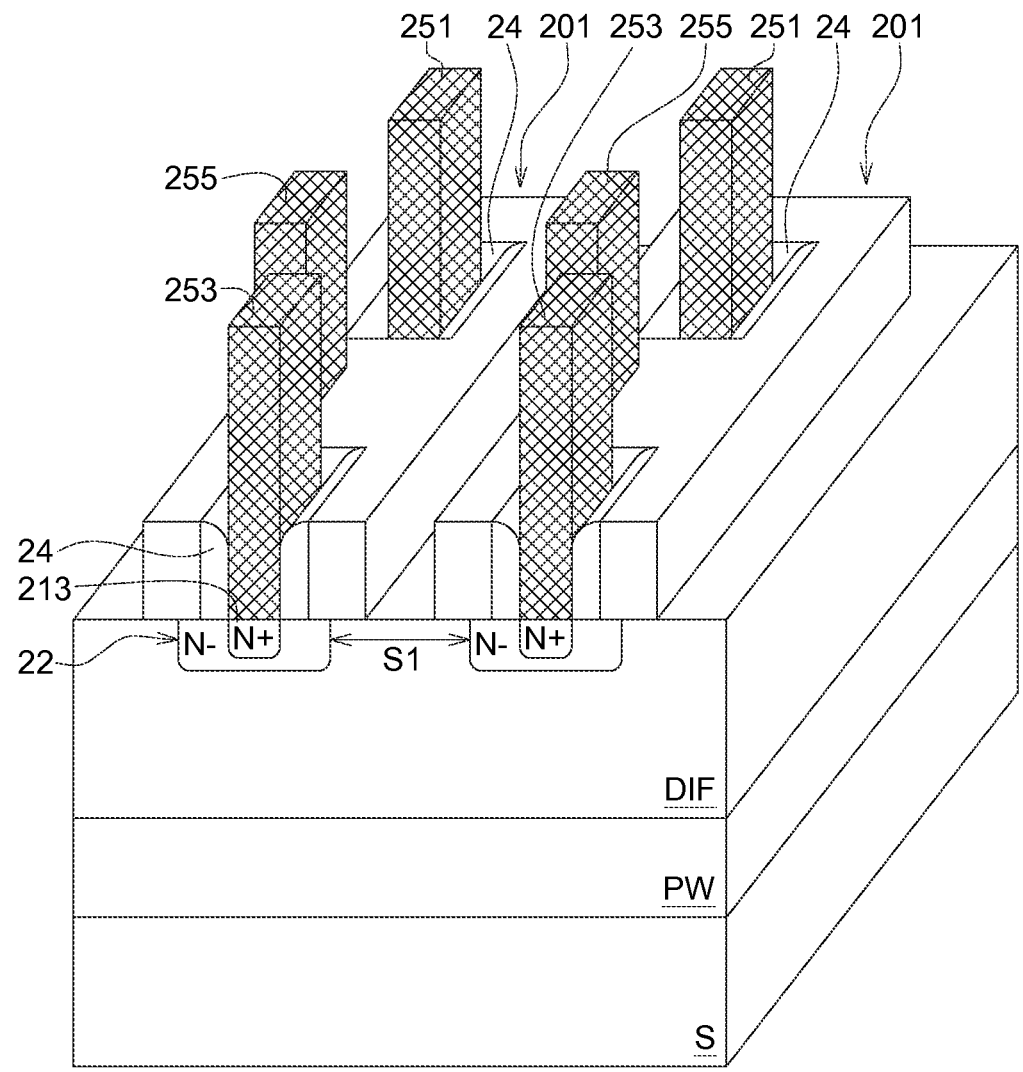
FIG. 6 is a perspective view illustrating two adjacent active devices of the semiconductor device of FIG. 4.

FIG. 4 illustrates a novel layout of a semiconductor device according to the embodiment of the disclosure. FIG. 5A depicts an active device of a semiconductor device according to the embodiment of the disclosure. FIG. 5B is an exploded view of a conductive guarding structure of the active device of FIG. 5A. FIG. 6 is a perspective view illustrating two adjacent active devices of the semiconductor device of FIG. 4. Please refer to FIG. 4~FIG. 6.

In the embodiment, a semiconductor device comprises a substrate S, a first well having the first conductive type (such as P-type) PW, a diffusion region DIF, and a plurality of active devices 20 formed within the diffusion region DIF (FIG. 4 and FIG. 6). The first well PW extends down from a surface of the substrate S, and the diffusion region DIF having the first conductive type (such as P-type) and extending down from a surface of the first well PW (FIG. 6). As shown in FIG. 4, those active devices 20 are arranged separately from each other, and all of then are formed within the non-isolated diffusion region DIF, wherein the active devices 20 are electrically isolated from each other by the diffusion region DIF. No STI exists between the adjacent active devices 20. In one embodiment, the diffusion region DIF is heavily doped with impurity of the first conductive type such as P+ for providing field isolation.

Also, each one of the active devices 20 comprises a conductive guarding structure 201 formed on the diffusion region DIF, and a light doping region 22 having the second conductive type (such as N−) and extending down from the surface of the diffusion region DIF, wherein the light doping region 22 is correspondingly confined within the conductive guarding structure 201. According to the embodiment, an isolating region (having an isolation distance S1 or S2) between the adjacent active devices 20 can be defined by the conductive guarding structures 201 of the adjacent active devices 20. As shown in FIG. 4, the adjacent active devices 20 arranged along the first direction such as x-direction are isolated by the isolating region having a first isolation distance S1, and the other adjacent active devices 20 arranged along the second direction such as y-direction are isolated by the isolating region having a second isolation distance S2. The first isolation distance S1 can be different from or equal to the second isolation distance S2. In one embodiment, the first isolation distance S1 is substantially equal to the second isolation distance S2. According to the embodiment, the space (S1/S2) between the adjacent active devices is STI free, and the embodied design is completely immune to any STI edge effect (ex: double-hump subthreshold leakage, degraded breakdown, variation by various STI layout, etc.) consequently.

In one embodiment, a conductive guarding structure 201 comprises a middle portion 201m, a first guarding portion 2011 and a second guarding portion 2012, as shown in FIG. 5A and FIG. 5B. The first guarding portion 2011 adjoins one side of the middle portion 201m for defining a first region 201a at the diffusion region DIF. The second guarding portion 2012 is positioned opposite to the first guarding portion 2011 and adjoins another side of the middle portion 201m for defining a second region 201b at the diffusion region DIF. Accordingly, the first region 201a is enclosed by the first guarding portion 2011 and the middle portion 201m, and the second region 201b is enclosed by the second guarding portion 2012 and the middle portion 201m.

As shown in FIG. 4, the first region 201a and the second region 201b are positioned within the light doping region 22. The light doping region 22 correspondingly encloses but spaced apart from the first region 201a and the second region 201b. In one embodiment, the light doping region 22 is positioned correspondingly to the first guarding portion 2011 and the second guarding portion 2012. For example, the boundary of the light doping region 22 (ex: the dashed line shown in one active device 20 of FIG. 4 and FIG. 5A) is substantially corresponding to the middles of the first guarding portion 2011 and the second guarding portion 2012, as shown in FIG. 4 and FIG. 5A.

Also, each of the active devices 20 further comprises a first contact region 211 having the second conductive type (such as N+) formed within the first region 201a of the conductive guarding structure 201, and a second contact region 213 having the second conductive type (such as N+) formed within the second region 201b of the conductive guarding structure 201. The first contact region 211 is spaced apart from the first guarding portion 2011 and the middle portion 201m, and the second contact region 213 is spaced apart from the second guarding portion 2012 and the middle portion 201m. In one embodiment, the first contact region 211 and the second contact region 213 functions as a drain region and a source region of the active devices 20, respectively.

As shown in FIG. 6, each of the active devices 20 further comprises a first contact 251 (ex: functioning as a drain) formed at the first contact region 211, and a second contact 253 (ex: functioning as a source) formed at the second contact region 213. Also, a gate contact 255 contacting the conductive guarding structure 201 is formed. In one embodiment, the gate contact 255 can be formed at the third contact region 215 in the middle portion 201m of the conductive guarding structure 201, wherein the gate contact 255 is positioned correspondingly within the light doping region 22. However, formation of the gate contact 255 is not limited to the position shown in the drawings, and other positions may be applicable as long as the gate contact 255 electrically connects the conductive guarding structure 201.

During the fabrication, the openings (corresponding to the first region 201a and the second region 201b) of the conductive guarding structure 201 are formed, and the light doping region 22 is then formed under the conductive guarding structure 201 by lightly doping impurities of the second conductive type (ex: N−), as shown in FIG. 6. Next, the spacers (such as oxide) with adequate shape are formed in the openings to define the first contact region 211 and the second contact region 213. Since the areas of the first contact region 211 and the second contact region 213 are quite small (especially for the semiconductor devices applied for the small electronic devices), the contacts such as the first contact 251, the second contact 253 and the gate contact 255 are formed at the corresponding positions, followed by the plug implantation to heavily dope impurities of the second conductive type (ex: N+) under the contacts. However, the present disclosure is not limited thereto. It is noted that the steps described here are for illustration only, and can be modified or altered for achieving the actual requirements of the applications.

Figure 7:
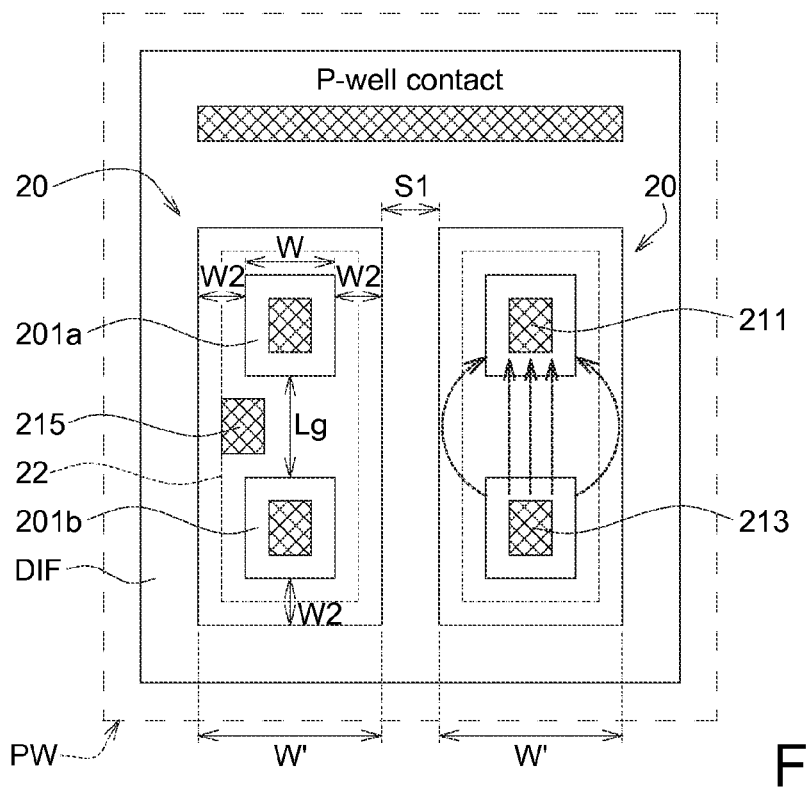
FIG. 7 depicts two adjacent active devices of FIG. 4 and drain current between source and drain of the active device according to the embodiment of the disclosure.

According to one embodiment, the conductive guarding structure 201 can be made from polysilicon, and the middle portion 201m of the conductive guarding structure 201 functions as a gate (ex: poly gate) of the active device 20. FIG. 7 depicts two adjacent active devices of FIG. 4 and drain current between source and drain of the active device according to the embodiment of the disclosure. Please also refer to FIG. 4 and FIG. 7. The middle portion 201m of the conductive guarding structure 201 functioning as a gate of the active device 20 has an effective channel width (W') along the first direction (such as x-direction) and a channel length (Lg) along a second direction (such as y-direction).

Figure 8:
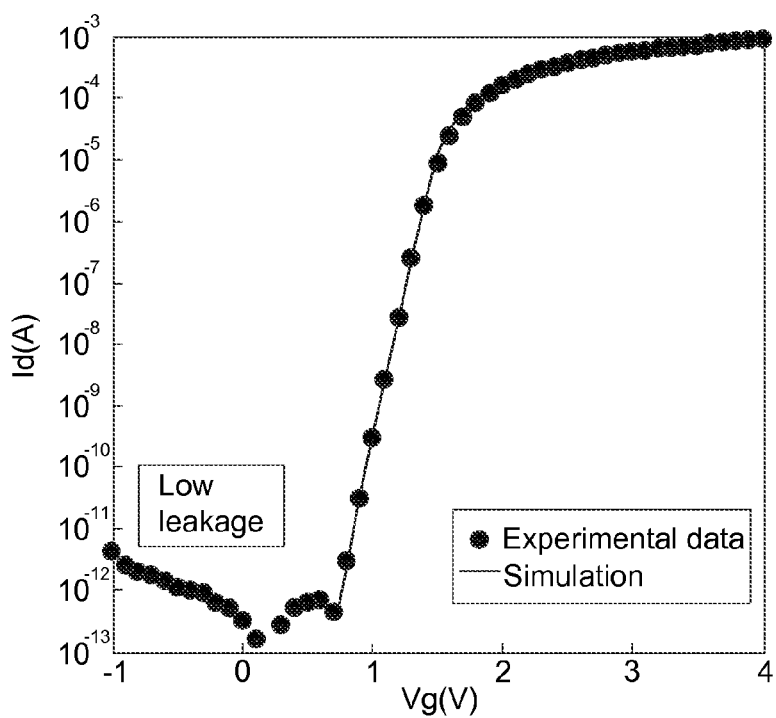
FIG. 8 shows $I_D$-$V_G$ characteristic curves of a novel layout transistor MOSFET according to the embodiment of the disclosure.

In one embodiment, the first direction is perpendicular to the second direction. As shown in FIG. 4 and FIG. 7, the first region 201a and the second region 201b are spaced apart by a distance of the channel length Lg. Also, each of the first guarding portion 2011 and the second guarding portion 2012 has a width W2, and each of the first region 201a and the second region 201b has a width W along the first direction (such as x-direction). The first contact formed at the first contact region 211 and a second contact formed at the second contact region 213 functions as a drain and a source. As shown in FIG. 7, drain currents between the source and the drain including the currents flowing along the shortest path between the source and the drain (i.e. denoted by the straight lines) and also the sidewall currents (i.e. denoted by the curved lines) flowing along the paths longer than the shortest path. Accordingly, the effective channel width W' (along the x-direction) of the active device 20 of the embodiment is substantially equal to the sum of the width W and twice the width W2 (W'=W+2×W2). The sidewall current has effective longer channel length, i.e. larger than Lg, and will not cause the double-hump leakage issue. In one embodiment, when the diffusion region DIF is heavily doped with impurity of the first conductive type such as P+, there is P+ outside the light doping region 22 as surrounding the gate for field isolation. According to the embodiment, parasitic leakage between two adjacent transistors can be effectively prohibited by the diffusion region DIF, and the prohibition can be achieved by providing the space (S1/S2) in between two active devices (ex: NMOS) with sufficient P-type doping (done by P+ implantation). FIG. 8 shows $I_D$–$V_G$ characteristic curves of a novel layout transistor MOSFET according to the embodiment of the disclosure. In FIG. 8, it is clearly indicated that no double-hump leakage occurs and the experimental data excellent fit with the simulation curve of the theoretical model. Also, extremely low leakage is observed when Vg is less than 0.7V.

Figure 1:
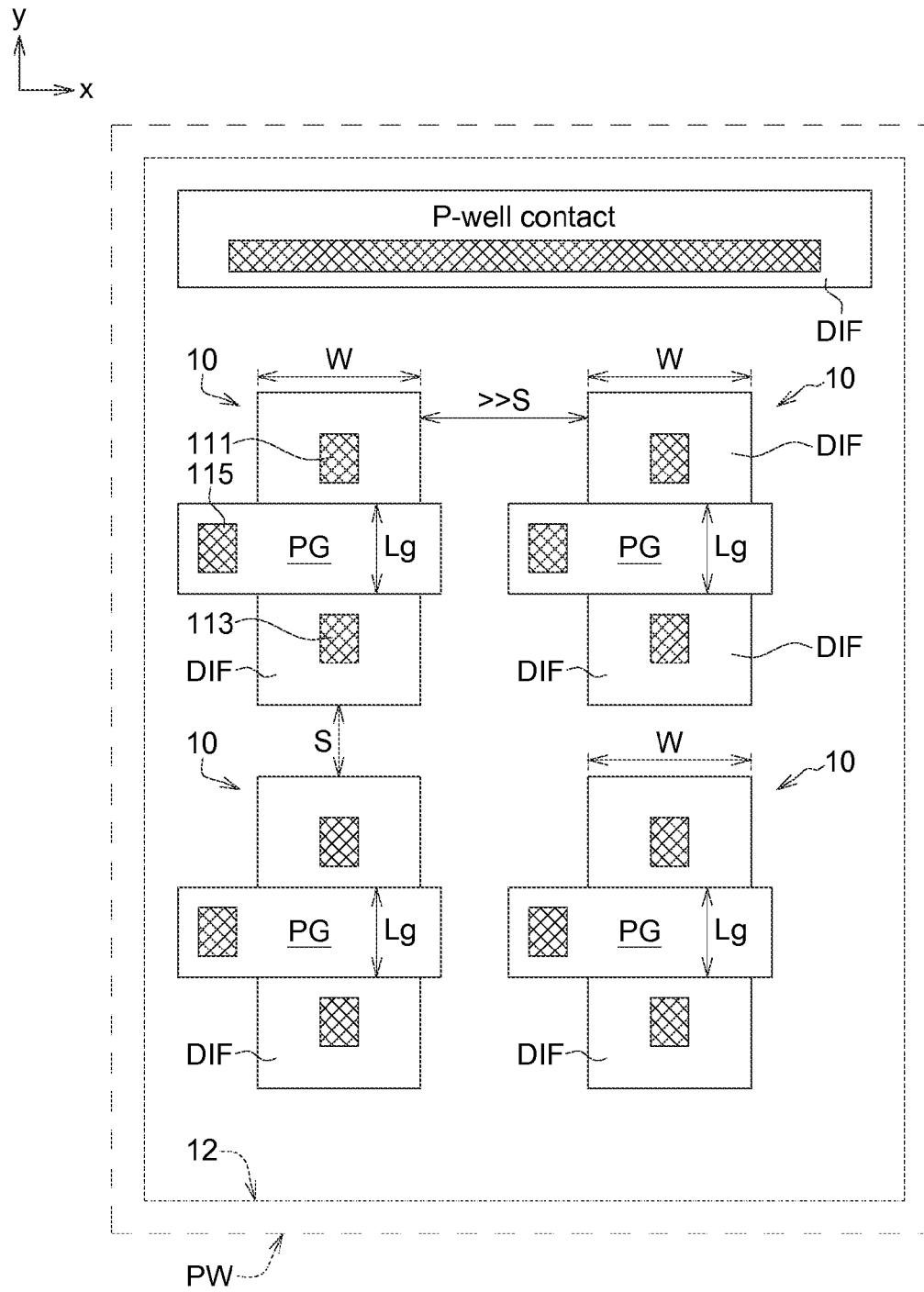
FIG. 1 (prior art) illustrates a conventional layout of a semiconductor device.
Figure 2:
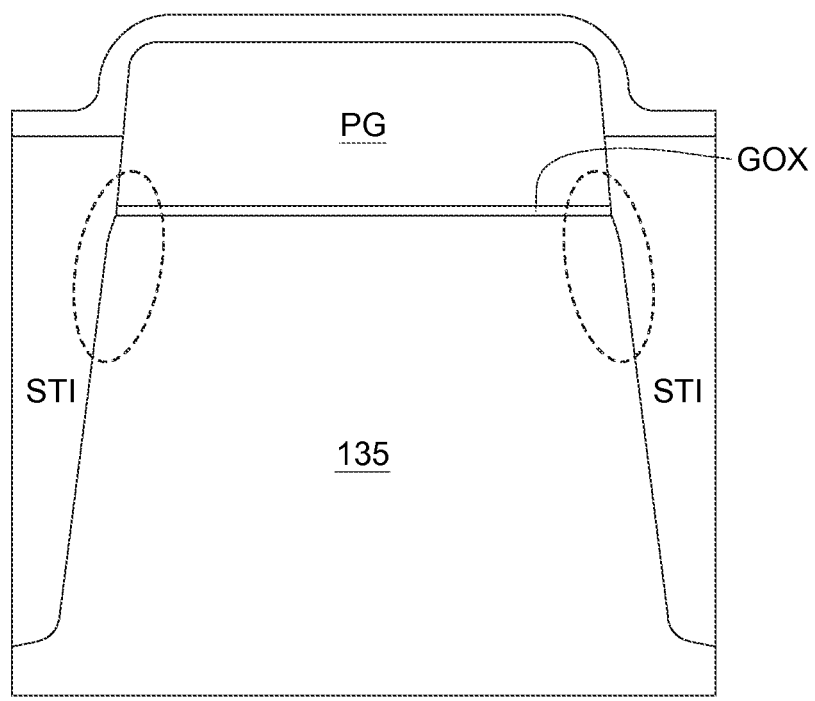
FIG. 2 (prior art) is a cross-sectional view showing the isolations besides the poly gate of a conventional semiconductor device.
Figure 3A:
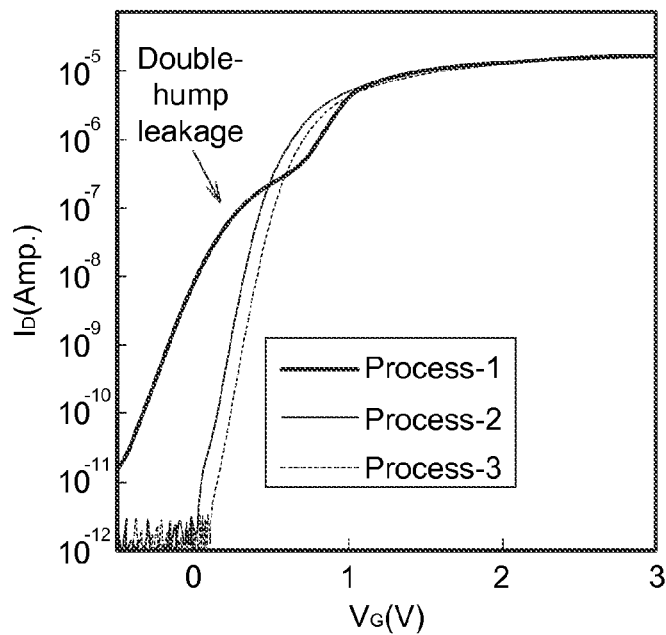
FIG. 3A (prior art) shows the $I_D$-$V_G$ characteristic curves of a typical low voltage (LV) NMOS transistor with 70 Å of the gate oxide and W/Lg=0.6 µm/0.4 µm, and the curves are measured at a drain bias $V_D$=0.1V.
Figure 3B:
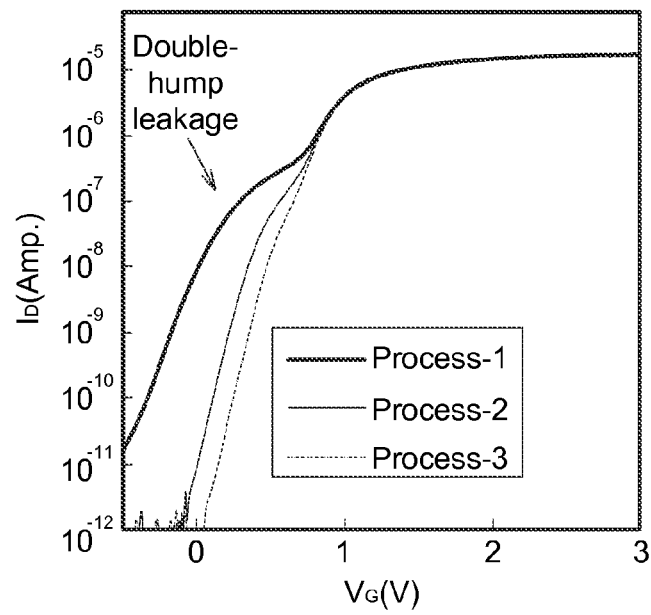
FIG. 3B (prior art) shows the $I_D$-$V_G$ characteristic curves of a typical high voltage (HV) NMOS transistor with 370 Å of the gate oxide and W/Lg=10 µm/1.6 µm, and the curves are measured at a drain bias VD=0.1V.

According to the aforementioned description, the semiconductor device applied with the active devices of the embodiment possess several characteristics, such as (1) the diffusion region DIF is not isolated (no STI in device active area); (2) use the conductive guarding structure (ex: poly gate) 201 itself to define both of the channel length and the channel width; (3) the light doping region 22 (ex: N−) and the heavy doping regions (ex: N+) (i.e. first contact region 211/second contact region 213/third contact region 215) are isolated in each gate area; and (4) the isolation distance between the conductive guarding structures (ex: poly gate) 201 has P+ impurities for field isolation. Compared to the conventional layout of the semiconductor device in FIG. 1, the embodied layout of the semiconductor device (as shown in FIG. 4) has several advantages. For example, the space (S1/S2) between the adjacent active devices is STI free, and the embodied design is completely immune to any STI edge effect (ex: double-hump subthreshold leakage, degraded breakdown, variation by various STI layout, etc.) consequently. Also, the pitch of the active devices can be reduced since the DIF/Poly extension concern no longer exists.

The active device of the embodiment can be applied to a high voltage (HV) semiconductor device or a low voltage (LV) semiconductor device. In the following description, exemplified design rules for a HV semiconductor device and a LV semiconductor device are provided below. However, it is understood the values of the related parameters are disclosed only for exemplification, not for limiting the scopes of the disclosure.

Please refer to FIG. 4 for the layout of a LV semiconductor device of an embodiment. To provide a product for NAND Flash operated at 3V, a maximum bias of about 3.8V is necessary. Related parameters of a LV semiconductor device operated at 3V are provided below for exemplification. In one embodiment for a LV semiconductor device operated at 3V, the channel length Lg is about 0.3 µm to about 0.4 µm to sustain the maximum 3.8V operation. The minimal width W of the first region 201a and the second region 201b is about 0.2 µm, and one of the first contact region 211 and the second contact region 213 is about 0.1 µm×0.1 µm (in each drain/source). The minimal width W2 of the first guarding portion 2011 and the second guarding portion 2012 is about 0.1 µm~0.15 µm. The space (assumed S1=S2=S) between the adjacent active devices 20 are in a distance of about 0.18 µm to 0.28 µm. Also, the pitch $D_P$ between the active devices 20 is about 0.68 µm. Accordingly, the active device pitch is around 0.68 µm, which can fit for the page buffer circuit design in NAND Flash.

Figure 9:
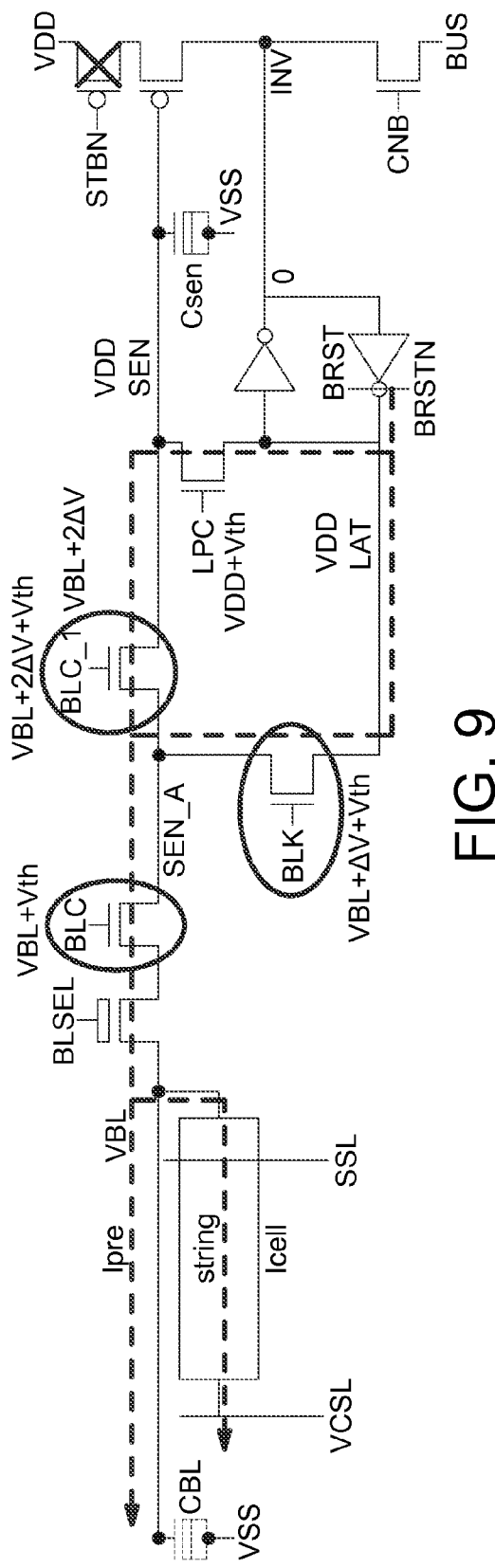
FIG. 9 shows a NAND Flash Page Buffer design with BL Clamp Devices.

FIG. 9 shows a NAND Flash Page Buffer design with BL Clamp Devices. In the NAND Flash page buffer design, the BLC, BLK, BLC_I devices (i.e. three selected areas in the circles) are critical. A very tight Vt distribution of these devices is required in order to accurately control the BL (bit line) bias during sensing. Also, a tight-pitch layout design rule is required for these devices because of many page buffer circuits. It is suggested that the embodied device is particularly suitable for achieving these purposes, which possesses at least the advantages of (1) tighter-pitch than conventional layout because no DIF rule needs to be concerned; and (2) tight Vt distribution and free from STI edge induced trouble and variation.

Figure 10:
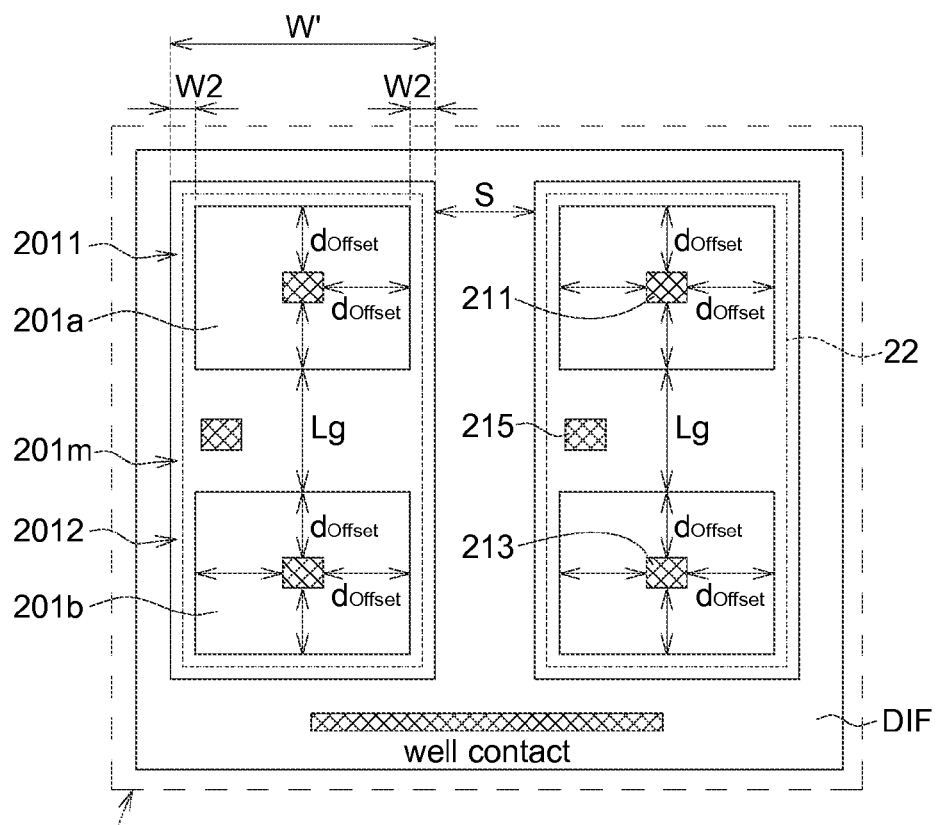
FIG. 10 depicts a layout of a HV semiconductor device of an embodiment.

FIG. 10 depicts a layout of a HV semiconductor device of an embodiment. Please also refer to the descriptions above for the related elements of the active devices of the embodied semiconductor device, and the identical elements of FIG. 10 and FIG. 4 are designated with the same reference numerals for clearly presenting the embodiments, and the details (ex: the light doping region 22 (N−) surrounded by the poly gate, and the first contact region 211/the second contact region 213 confined within the first region 201a/the second region 201b) have been clearly described above and are not redundantly repeated. The major difference between the LV and HV semiconductor devices is the distance between the first contact region 211/the second contact region 213 and the first guarding portion 2011/the second guarding portion 2012 in the HV semiconductor device should be increased to sustain HV operation. Since N+ for the contact regions (211/213/215) is carried out after contact etching, the heavily doped N+ contact regions (211/213/215) are only confined within the small contact area.

Related parameters of a 30V HV NMOS device in NAND Flash are provided below for exemplification. As shown in FIG. 10, in one embodiment for a HV semiconductor device, the channel length Lg is about 1.2 µm to about 2 µm to sustain the maximum 30V operation. In one embodiment, the minimal distance from the contact region (i.e. N+, the first contact region 211 and the second contact region 213) to the poly gate (i.e. the first guarding portion 2011 and the second guarding portion 2012) is denoted as the distance $d_{offset}$, and the distance $d_{offset}$ is about 0.5 µm to 1 µm to offer sufficient N+ drain offset, thereby minimizing GIDL (gate induced drain leakage)-induced breakdown. In one embodiment, the distance $d_{offset}$ is about 0.8 µm. Also, in one embodiment, the minimal size of the first contact region 211 and/or the second contact region 213 is about 0.1 µm×0.1 µm (in each drain/source). In one embodiment, the minimal width W2 of the first guarding portion 2011 and the second guarding portion 2012 is about 0.2 µm. Thus, relationship between the distance $d_{offset}$ (about 0.5 µm to 1 µm) and the width W2 (about 0.2 µm) of a HV device of one embodiment can be represented as: 2.5× W2≤$d_{offset}$≤5×W2. In one embodiment, the minimal channel width W' is about 2.1 µm. Also, the space (with P-type implantation for field isolation) between the adjacent active devices 20 has a minimal distance (assumed S1=S2=S) of about 1 µm.

Figure 11:
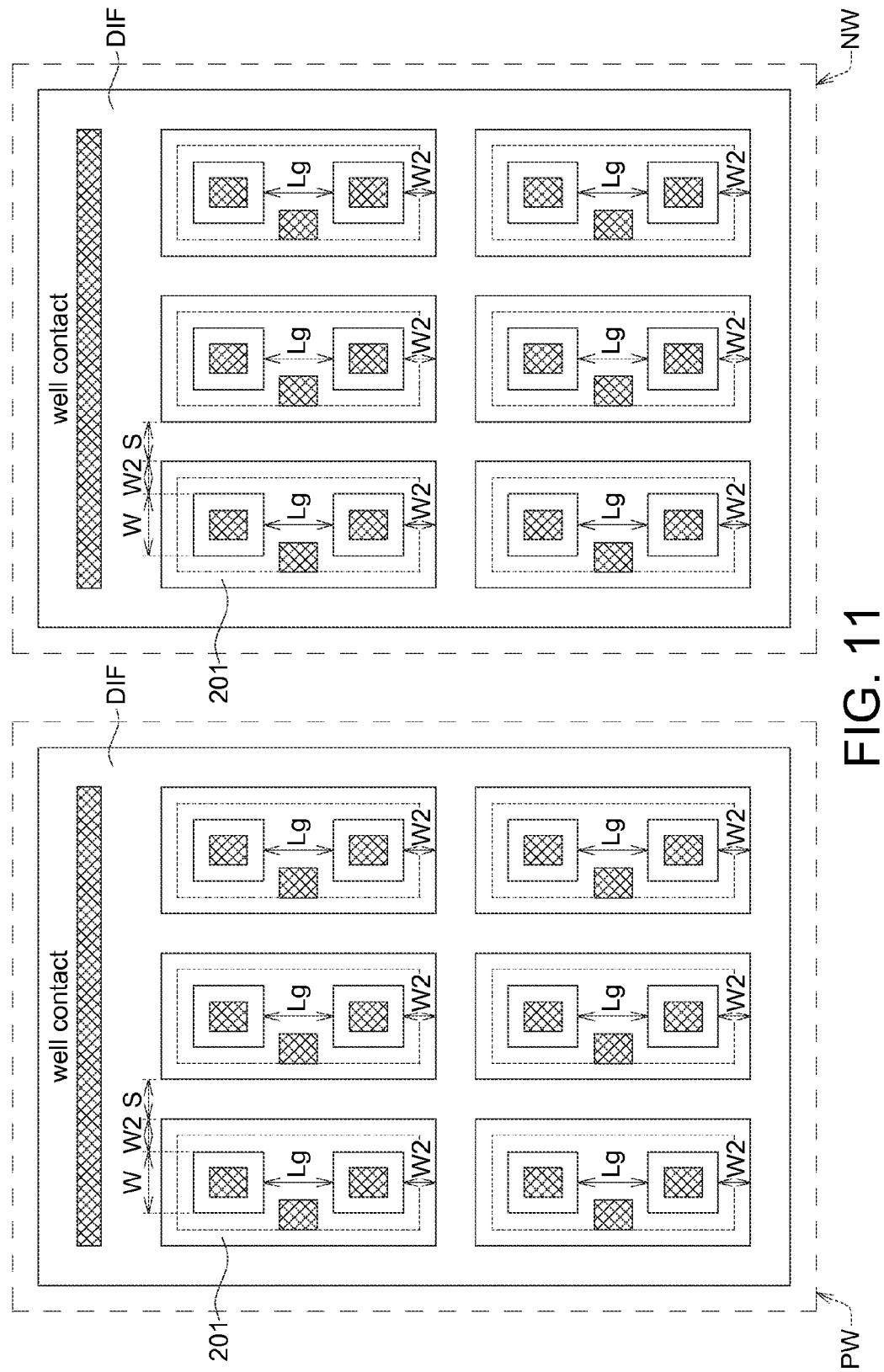
FIG. 11 is one of applicable CMOS layouts having active devices according to the embodiment of the disclosure.
Figure 12A:
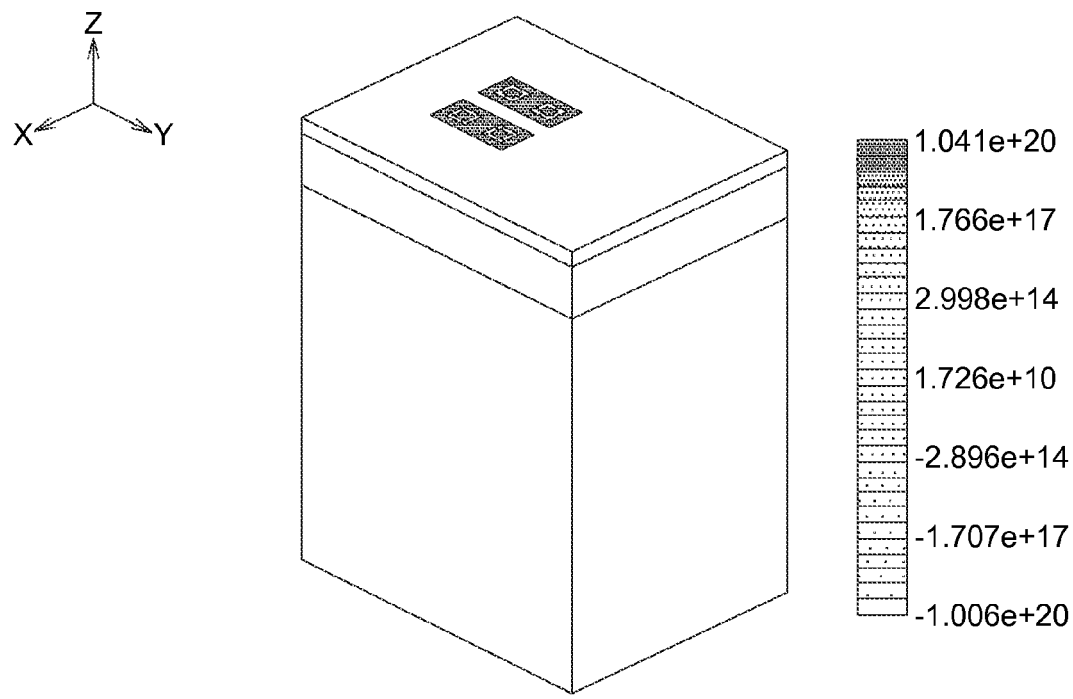
FIG. 12A-FIG. 12D respectively show the perspective view, the cross-sectional views on the YZ-plane, the XZ-plane and the XY-plane of an embodied STI-free transistor according to one of the TCAD simulations.
Figure 12B:
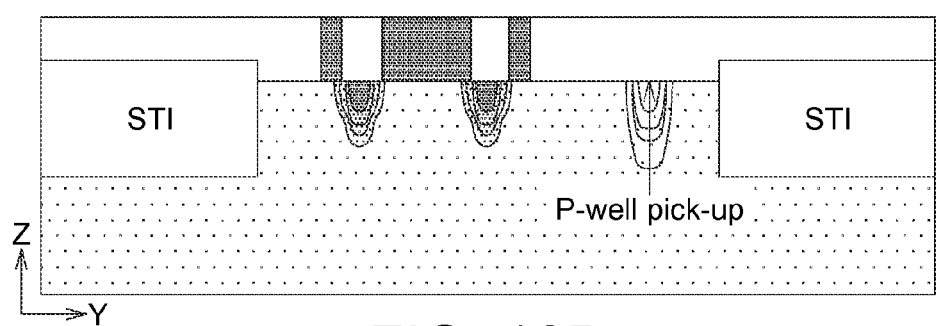
Figure 12C:
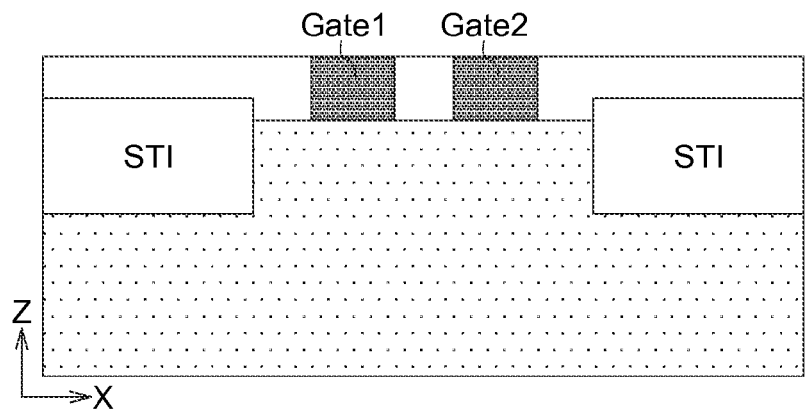
Figure 12D:
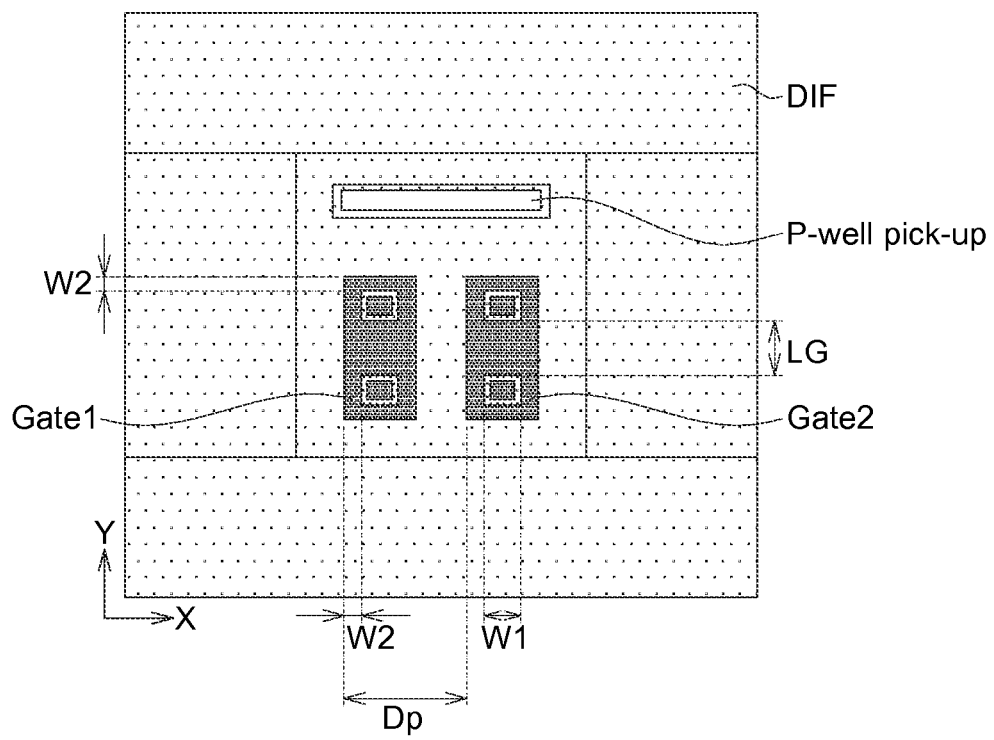

Although the conductive types of the first well and the light doping region 22 are exemplified as P type and N−, the present disclosure is not limited to the exemplification above. For the PMOS fabrication, it can be designed by just simply inversing the doping types of the well and junction. For example, the P type well PW and the N− light doping region 22 of the NMOS are substituted by the N type well NW and the P− light doping region for the PMOS. Accordingly, a CMOS comprises the NMOS devices sharing the P-well and the PMOS devices sharing the N-well. FIG. 11 is one of applicable CMOS layouts having active devices according to the embodiment of the disclosure. In one application to design a CMOS layout for bulk device, it is suggested that the NMOS devices in a shared P-well is separated from the PMOS devices in another shared N-Well, as shown in FIG. 11.

Moreover, it is more convenient for forming the active devices of the embodiment in the thin-body SOI (silicon-on-insulation) wafer.

The DIF (diffusion region) isolation can be made during the polysilicon etching for forming the conductive guarding structure 201 (i.e. self-aligned etching), thus the space (S1/S2) can be further minimized. Because of no well isolation concern, it is even possible to design the N/P MOSFET in nearby region to optimize the layout design. Also, it is floating-body MOSFET due to the absence of body contact.

<Related Experiments, Simulations and Results>

Many experiments and simulations (such as Technology Computer Aided Design, known as "TCAD") have been conducted to investigate the result of the novel design of the embodiment, and some of them are disclosed herein to prove the excellent results of the configurations in the novel layout (such as good field isolation between the active devices, negligible drain current of the STI-free transistor). FIG. 12A-FIG. 12D respectively show the perspective view, the cross-sectional views on the YZ-plane, the XZ-plane and the XY-plane of an embodied STI-free transistor according to one of the TCAD simulations. Please also refer to FIG. 4 and related descriptions for the meanings of the related parameters. In this TCAD simulation, "Gate 1" and "Gate 2" are gates of two adjacent active devices of the embodiment, and related parameters determined in the TCAD simulation including: GOX (gate oxide)=7 nm, SPR=60 nm, Lg (channel length)=0.4 μm, W1=0.2 μm, W2=0.1 μm, diffusion contact (i.e. N+, the first contact region 211 and the second contact region 213)=0.1 μm×0.1 μm, P-well pick-up to the active area (AA) distance=0.5 μm, HDD (heavy doping concentration) =1×10$^{20}$ cm$^{-3}$, LDD (light doping concentration)=5×10$^{18}$ cm$^{-3}$, N+ gate doping concentration=1×10$^{20}$ cm$^{-3}$, constant P-well (PW) doping concentration=6×10$^{17}$ cm$^{-3}$, and D$_P$ (pitch of active devices)=0.68 μm.

Figure 13A:
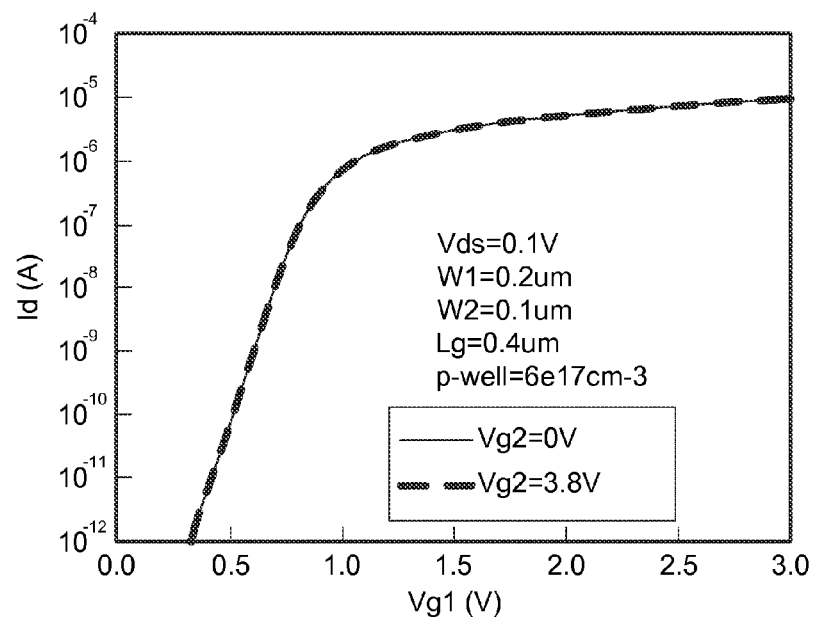
FIG. 13A shows $I_D$-$V_G$ characteristic curves of the embodied STI-free transistor in the TCAD simulation.
Figure 13B:
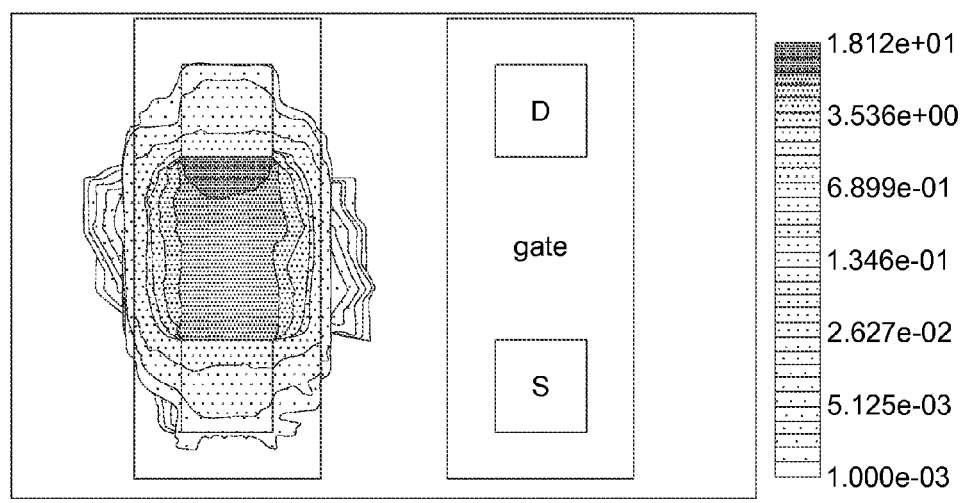
FIG. 13B is current density simulation at Vg1=0.5V, Vg2=3.8V and Vds=0.1V.

FIG. 13A shows I$_D$-V$_G$ characteristic curves of the embodied STI-free transistor in the TCAD simulation. Vg1 and Vg2 are voltage applied to the Gate 1 and Gate 2. Two I$_D$-V$_G$ characteristic curves in FIG. 13 are obtained by applying 0V of Vg1 and 3.8V of Vg2. According to the results of FIG. 13A, altering bias of the device labeled with "Gate 2" does not change the Id-Vg curve for the device labeled with "Gate 1", which proves the well-behaved field isolation. FIG. 13B is current density simulation at Vg1=0.5V, Vg2=3.8V and Vds=0.1V. It is observed from the current density simulation of FIG. 13B that drain current flows mostly along the path with the shortest distance, so that the effective channel width can be treated to be equal to W1.

Figure 14A:
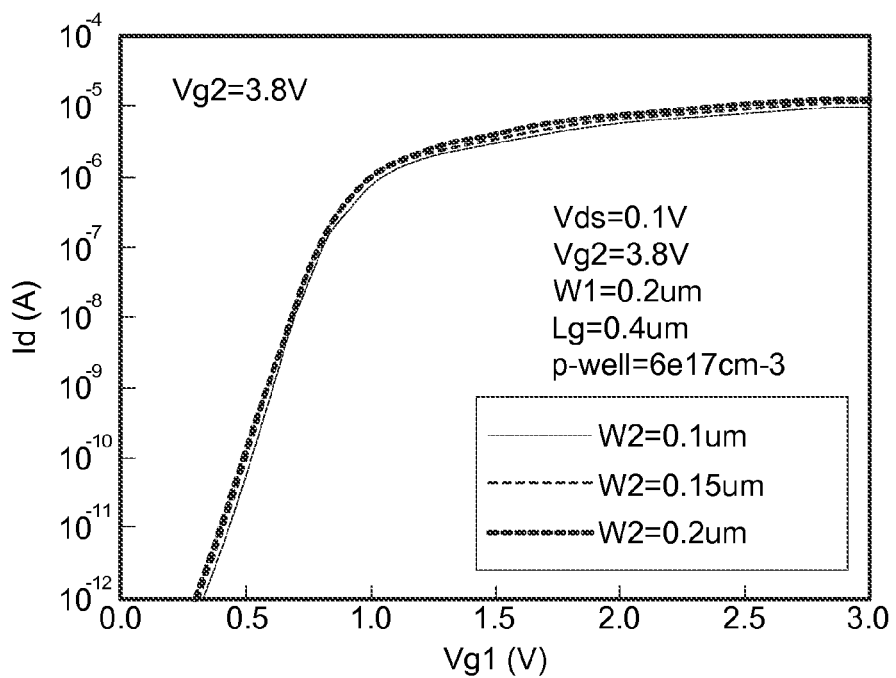
FIG. 14A shows $I_D$-$V_G$ characteristic curves of the embodied STI-free transistors in the TCAD simulation, by varying widths W2 of 0.1 µm, 0.15 µm and 0.2 µm.
Figure 14B:
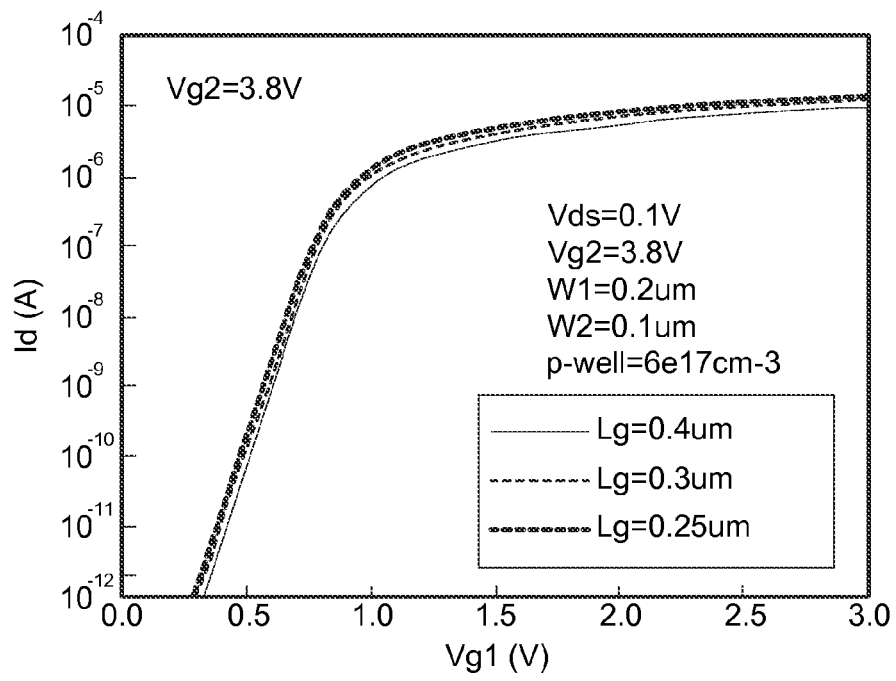
FIG. 14B shows $I_D$-$V_G$ characteristic curves of the embodied STI-free transistors in the TCAD simulation, by varying channel length Lg of 0.25 µm, 0.3 µm and 0.4 µm.

FIG. 14A shows I$_D$-V$_G$ characteristic curves of the embodied STI-free transistors in the TCAD simulation, by varying widths W2 of 0.1 μm, 0.15 μm and 0.2 μm. In FIG. 14A, related parameters in the STI-free transistors include: Vds=0.1V, Vg2=3.8V, W1=0.2 μm, Lg=0.4 μm and P-well doping concentration is 6×10$^{17}$ cm$^{-3}$. FIG. 14B shows I$_D$-V$_G$ characteristic curves of the embodied STI-free transistors in the TCAD simulation, by varying channel length Lg of 0.25 μm, 0.3 μm and 0.4 μm. In FIG. 14B, related parameters in the STI-free transistors include: Vds=0.1V, Vg2=3.8V, W1=0.2 μm, W2=0.1 μm and P-well doping concentration is 6×10$^{17}$ cm$^{-3}$. Results of FIG. 14A and FIG. 14B have indicated that narrow-width and short-channel effect look minor. Also, when W2=0.2 μm, the space between active devices can be reduced to only 0.08 μm, and no noticeable increase of leakage current is observed.

Figure 15A:
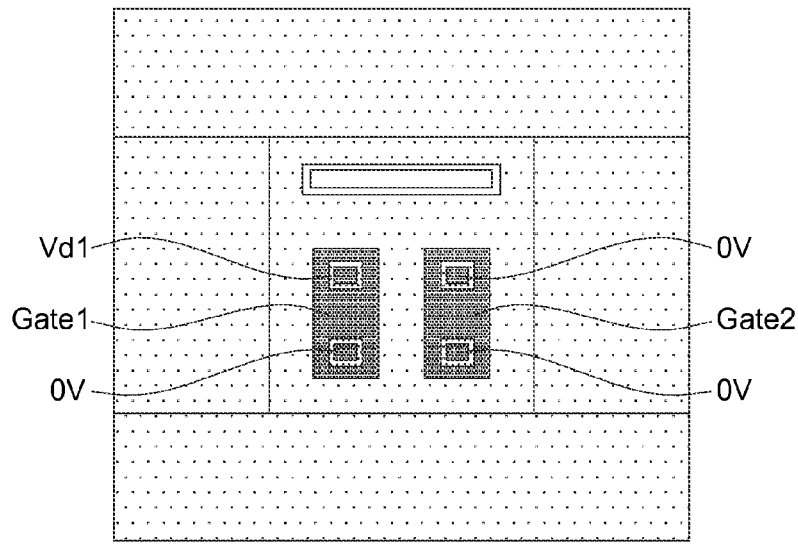
FIG. 15A shows a cross-sectional view on the XY-plane of an embodied STI-free transistor in TCAD simulation, which labels voltages applied to the contact regions of active devices.
Figure 15B:
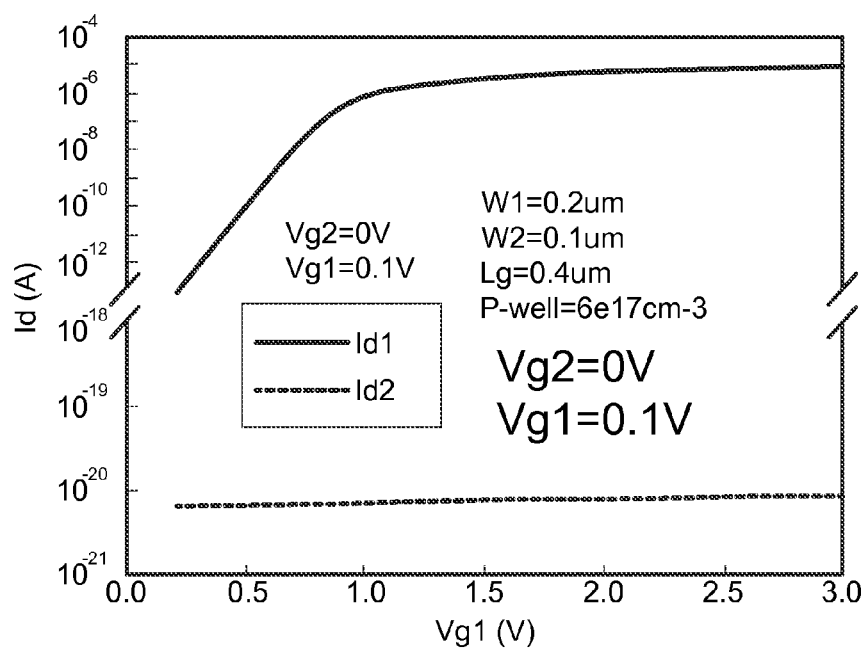
FIG. 15B~FIG. 15D show $I_D$-$V_G$ characteristic curves of the embodied STI-free transistors in the TCAD simulation, at condition of Vg2=0V and Vd1=0.1V in FIG. 15B, condition of Vg2=0V and Vd1=3.8V in FIG. 15C, condition of Vg2=3.8V and Vd1=0.1V in FIG. 15D, and condition of Vg2=3.8V and Vd1=3.8V in FIG. 15E.
Figure 15C:
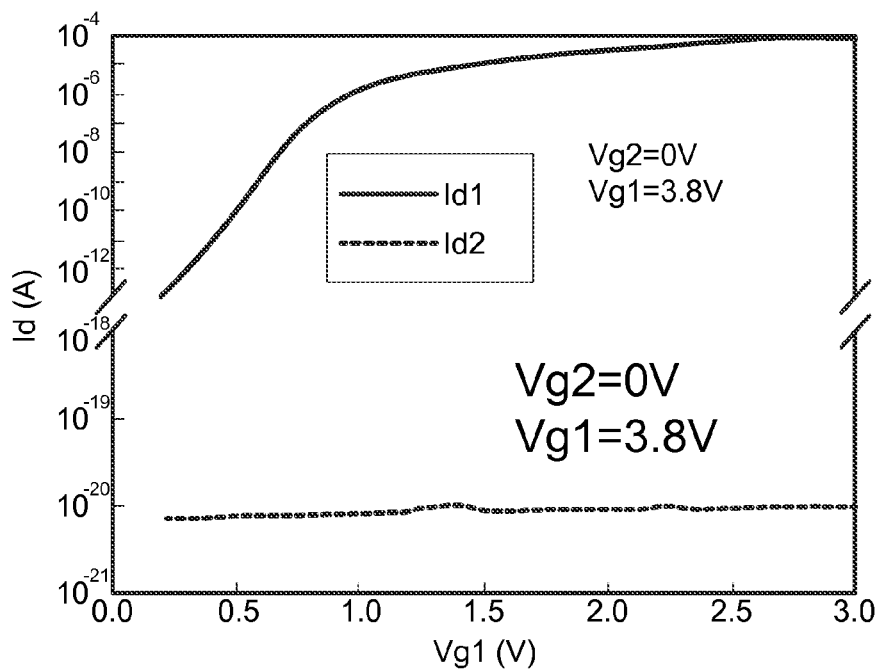
Figure 15D:
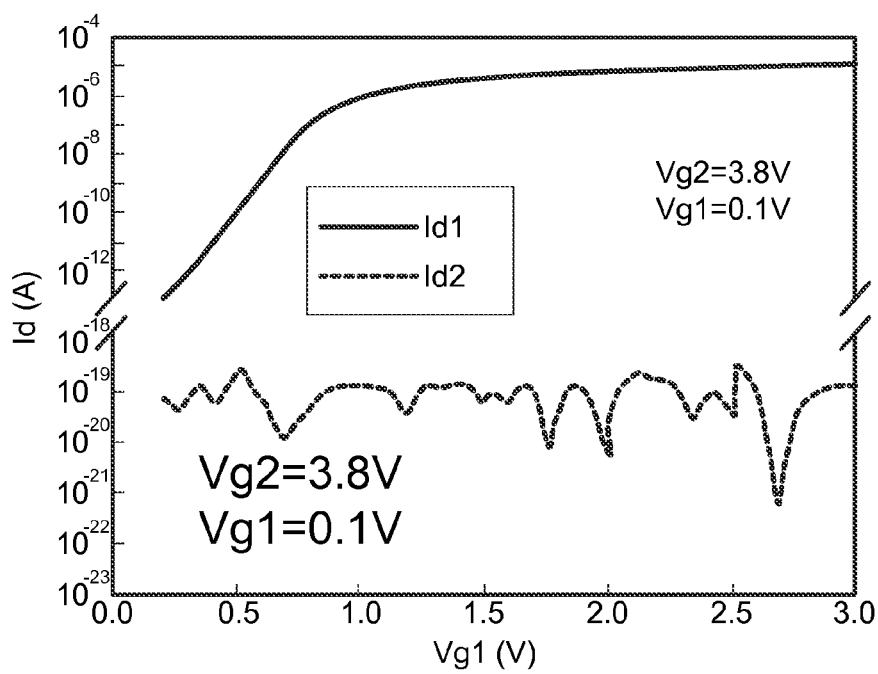
Figure 15E:
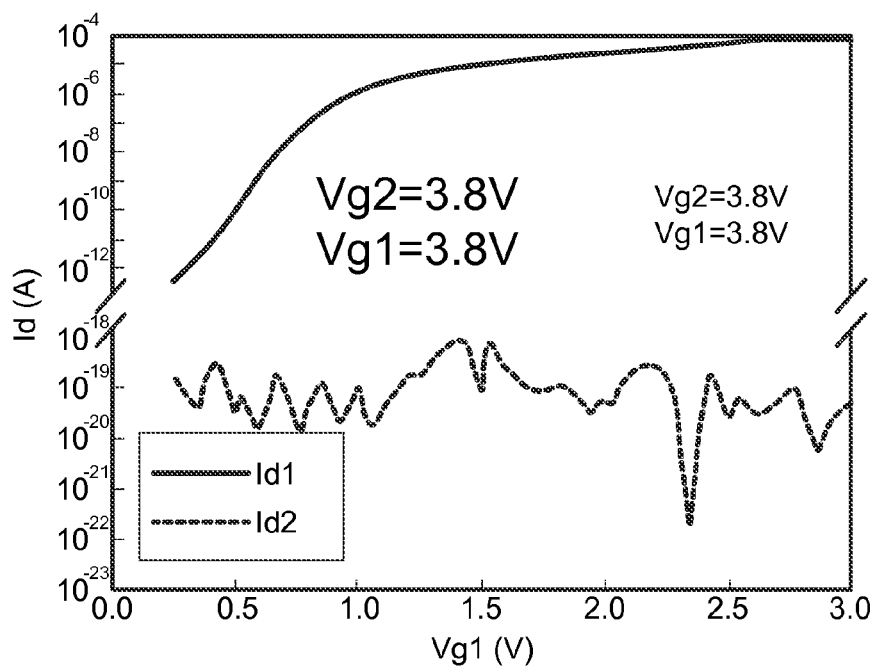

FIG. 15A shows a cross-sectional view on the XY-plane of an embodied STI-free transistor in TCAD simulation, which labels voltages applied to the contact regions of active devices. FIG. 15B~FIG. 15D show I$_D$-V$_G$ characteristic curves of the embodied STI-free transistors in the TCAD simulation, at condition of Vg2=0V and Vd1=0.1V in FIG. 15B, condition of Vg2=0V and Vd1=3.8V in FIG. 15C, condition of Vg2=3.8V and Vd1=0.1V in FIG. 15D, and condition of Vg2=3.8V and Vd1=3.8V in FIG. 15E. Results indicated that Gate-2 transistor shows negligible drain current regardless of bias condition, indicating excellent field isolation.

Figure 16:
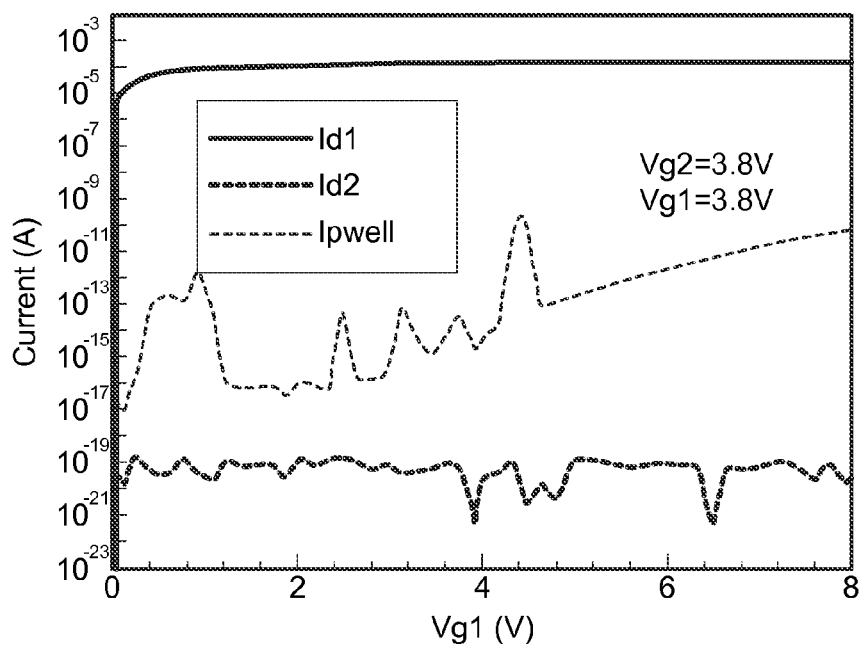
FIG. 16 show $I_D$-$V_G$ characteristic curves of Id1 (drain current of the Gate-1 transistor), Id2 (drain current of the Gate-2 transistor) and Ip-well (current in the p-well) of the embodied STI-free transistor in the TCAD simulation, at condition of Vg2=3.8V and Vd1=3.8V.

FIG. 16 show I-V$_{d1}$ characteristic curves of Id1 (drain current of the Gate-1 transistor), Id2 (drain current of the Gate-2 transistor) and Ip-well (current in the p-well) of the embodied STI-free transistor in the TCAD simulation, at condition of Vg2=3.8V and Vg1=3.8V. The result indicated that the P-well current shows up as Vd1 is increased. Also, Id2 remains infinitesimally small even when Vd1 is 8V.

According to the aforementioned description, the semiconductor device applied with the active devices of the embodiment use a conductive guarding structure (such as poly gate) of each active device to define both channel length and width. The semiconductor device of the embodiment can comprises NMOS, PMOS or CMOS. For NMOS, the N+ junction is surrounded by the conductive guarding structure (ex: poly gate) so that the active device (STI-free) can be self-isolated by the conductive guarding structure (ex: poly gate). Also, the area (i.e. a diffusion region DIF) outside the conductive guarding structure (ex: poly gate) can be implanted by P-type impurities for field isolation. The embodied layout of the semiconductor device is completely immune to any STI edge effect such as double-hump subthreshold leakage, degraded breakdown, variation by various STI layout, which successfully solve undesired STI edge issues of the conventional semiconductor device. Also, the pitch of the active devices can be further reduced since the DIF/Poly extension concern no longer exists. Additionally, the results of simulations have proven the excellent field isolation and no noticeable increase of leakage current of the embodied semiconductor device.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
    a substrate;
    a first well having a first conductive type and extending down from a surface of the substrate;
    a diffusion region doped with impurity of the first conductive type and extending down from a surface of the first well; and
    a plurality of active devices formed within the diffusion region, and the active devices arranged separately from each other,
    wherein the active devices are electrically isolated from each other by the diffusion region, and the conductive guarding structure comprises:
    a middle portion;
    a first guarding portion, adjoining one side of the middle portion for defining a first region at the diffusion region, wherein the first region is enclosed by the first guarding portion and the middle portion; and
    a second guarding portion, opposite to the first guarding portion and adjoining another side of the middle portion for defining a second region at the diffusion region, wherein the second region is enclosed by the second guarding portion and the middle portion.

2. The semiconductor device according to claim 1, wherein one of the active devices comprises:
    a conductive guarding structure formed on the diffusion region; and
    a light doping region having a second conductive type, and the light doping region extending down from a surface of the diffusion region and correspondingly confined within the conductive guarding structure.

3. The semiconductor device according to claim 2, wherein an isolating region between the adjacent active devices is defined by the conductive guarding structures of said adjacent active devices.

4. The semiconductor device according to claim 1, wherein the middle portion functioning as a gate of the active device has a channel width (W') along a first direction and a channel length (Lg) along a second direction, and the first region and the second region are spaced apart by a distance of the channel length.

5. The semiconductor device according to claim 1, wherein the first region and the second region are positioned within the light doping region.

6. The semiconductor device according to claim 1, wherein said one of the active devices further comprises:
- a first contact region having the second conductive type formed within the first region of the conductive guarding structure, and the first contact region spaced apart from the first guarding portion and the middle portion; and
- a second contact region having the second conductive type formed within the second region of the conductive guarding structure, and the second contact region spaced apart from the second guarding portion and the middle portion.

7. The semiconductor device according to claim 6, wherein said one of the active devices further comprises a first contact formed at the first contact region and a second contact formed at the second contact region.

8. The semiconductor device according to claim 1, wherein a space (S) between the adjacent active devices is in a range of 0.18 μm to 0.28 μm when the semiconductor device is a low voltage (LV) device.

9. The semiconductor device according to claim 1, wherein a space (S) between the adjacent active devices is in a range of 0.8 μm to 1.2 μm when the semiconductor device is a high voltage (HV) device.

10. The semiconductor device according to claim 1, wherein a space (S) between the adjacent active devices is STI free.

11. An active device, formed within a diffusion region having a first conductive type in a substrate, and the active device comprising:
- a conductive guarding structure, comprising:
- a middle portion;
- a first guarding portion, adjoining one side of the middle portion for defining a first region at the diffusion region, wherein the first region is enclosed by the first guarding portion and the middle portion; and
- a second guarding portion, opposite to the first guarding portion and adjoining another side of the middle portion for defining a second region at the diffusion region, wherein the second region is enclosed by the second guarding portion and the middle portion;
- a first contact region having a second conductive type formed within the first region of the conductive guarding structure, and the first contact region spaced apart from the first guarding portion and the middle portion; and
- a second contact region having the second conductive type formed within the second region of the conductive guarding structure, and the second contact region spaced apart from the second guarding portion and the middle portion.

12. The active device according to claim 11, further comprising a light doping region having the second conductive type, and the light doping region extending down from a surface of the diffusion region and correspondingly confined within the conductive guarding structure.

13. The active device according to claim 12, wherein the first region and the second region are positioned within the light doping region.

14. The active device according to claim 11, further comprising a first contact formed at the first contact region and a second contact formed at the second contact region.

15. The active device according to claim 11, wherein each of the first region and the second region has a width W along a first direction, and each of the first guarding portion and the second guarding portion has a width W2 along the first direction, and an effective channel width of the active device is represented as W+2×W2.

16. The active device according to claim 11 is a high voltage (HV) device, wherein each of the first guarding portion and the second guarding portion has a width W2, each of the first contact region and the second contact region respectively spaced apart from the first guarding portion and the second guarding portion has a distance doffset, and 2.5× W2≤doffset≤5×W2.

17. The active device according to claim 11, wherein the middle portion functioning as a gate of the active device has a channel width (W) along a first direction and a channel length (Lg) along a second direction, and the first region and the second region are spaced apart by a distance of the channel length.

18. The active device according to claim 11, wherein a peripheral area surrounding the active device is STI free.

19. The active device according to claim 11, wherein a peripheral area surrounding the active device is the diffusion region heavily doped with impurities of the first conductive type.

* * * * *